(12) United States Patent
Bono et al.

(10) Patent No.: US 11,532,768 B2
(45) Date of Patent: Dec. 20, 2022

(54) OPTOELECTRONIC DEVICE INCLUDING A GATE AND A CATHODE COUPLED TO ONE ANOTHER

(71) Applicants: COMMISSARIAT A L'ENERGIE ATOMIQUE ET AUX ENERGIES ALTERNATIVES, Paris (FR); THALES, Courbevoie (FR)

(72) Inventors: Hubert Bono, Grenoble (FR); Ivan-Christophe Robin, Grenoble (FR)

(73) Assignees: COMMISSARIAT A L'ENERGIE ATOMIQUE ET AUX ENERGIES ALTERNATIVES, Paris (FR); THALES, Courbevoie (FR)

(*) Notice: Subject to any disclaimer, the term of this patent is extended or adjusted under 35 U.S.C. 154(b) by 177 days.

(21) Appl. No.: 16/962,991

(22) PCT Filed: Jan. 17, 2019

(86) PCT No.: PCT/FR2019/050096
§ 371 (c)(1),
(2) Date: Jul. 17, 2020

(87) PCT Pub. No.: WO2019/141948
PCT Pub. Date: Jul. 25, 2019

(65) Prior Publication Data
US 2020/0343413 A1 Oct. 29, 2020

(30) Foreign Application Priority Data
Jan. 19, 2018 (FR) .................................... 18 50444

(51) Int. Cl.
*H01L 33/38* (2010.01)
*H01L 33/00* (2010.01)
(Continued)

(52) U.S. Cl.
CPC ........ *H01L 33/382* (2013.01); *H01L 33/0095* (2013.01); *H01L 33/387* (2013.01);
(Continued)

(58) Field of Classification Search
CPC . H01L 33/382; H01L 33/0095; H01L 33/387; H01L 33/44; H01L 33/62; H01L 2933/0016; H01L 2933/0025
See application file for complete search history.

(56) References Cited

U.S. PATENT DOCUMENTS 6,207,977 B1* 3/2001 Augusto ............... H01L 29/456
257/E21.643
9,054,232 B2* 6/2015 Chung ................ H01L 25/0657
(Continued)

FOREIGN PATENT DOCUMENTS

EP 2 819 184 A1 12/2014
EP 2 960 951 A1 12/2015

OTHER PUBLICATIONS

U.S. Appl. No. 14/779,516, filed Sep. 23, 215, Ivan-Christophe Robin, et al.
(Continued)

*Primary Examiner* — Su C Kim
(74) *Attorney, Agent, or Firm* — Oblon, McClelland, Maier & Neustadt, L.L.P.

(57) ABSTRACT

An optoelectronic device including: a first, p-doped semiconductor layer and a second, n-doped semiconductor layer which are superposed and form a p-n junction; a first electrode electrically connected to the first semiconductor layer and forming an anode of the device; a gate positioned against at least one lateral flank of the first semiconductor layer; a second electrode, positioned against a lateral flank of the second semiconductor layer, electrically connected to the second semiconductor layer and electrically isolated
(Continued)

from the first semiconductor layer; and in which a portion of the second electrode is positioned against the gate such that the second electrode is electrically connected to the gate and forms both a gate electrode and a cathode of the device.

14 Claims, 5 Drawing Sheets

(51) Int. Cl.
*H01L 33/44* (2010.01)
*H01L 33/62* (2010.01)

(52) U.S. Cl.
CPC .............. *H01L 33/44* (2013.01); *H01L 33/62* (2013.01); *H01L 2933/0016* (2013.01); *H01L 2933/0025* (2013.01)

(56) References Cited

U.S. PATENT DOCUMENTS

| | | |
|---|---|---|
| 2011/0049555 A1 | 3/2011 | Engl et al. |
| 2011/0062488 A1 | 3/2011 | Uemura et al. |
| 2012/0074441 A1 | 3/2012 | Seo et al. |
| 2013/0299841 A1* | 11/2013 | Ranglack .............. H01L 25/167 257/E33.025 |
| 2014/0353708 A1 | 12/2014 | Seo et al. |
| 2015/0243844 A1 | 8/2015 | Seo et al. |
| 2015/0255686 A1 | 9/2015 | Seo et al. |
| 2015/0340579 A1 | 11/2015 | Seo et al. |
| 2016/0163941 A1 | 6/2016 | Seo et al. |
| 2016/0351758 A1 | 12/2016 | Herrmann et al. |
| 2016/0365382 A1 | 12/2016 | Seo et al. |
| 2017/0104139 A1 | 4/2017 | Seo et al. |
| 2018/0351057 A1 | 12/2018 | Seo et al. |
| 2019/0006413 A1* | 1/2019 | Jacob .................... H01L 33/007 |
| 2019/0035990 A1 | 1/2019 | Seo et al. |

OTHER PUBLICATIONS

U.S. Appl. No. 15/769,962, filed Apr. 20, 2018, Hubert Bono, et al.
U.S. Appl. No. 16/628,223, filed Jan. 2, 2020, Ivan-Christophe Robin, et al.
International Search Report dated Apr. 3, 2019 in PCT/FR2019/050096 filed on Jan. 17, 2019, 2 pages.
French Preliminary Search Report dated Oct. 10, 2018 in French Application No. 1850444 filed on Jan. 19, 2018, 1 page.
J. D. Thomson et al., "The influence of acceptor anneal temperature on the performance of InGaN/GaN quantum well light-emitting diodes," Journal of Applied Physics 99, 024507, 2006, doi: 10.1063/1.2165405 (total 8 pages).

* cited by examiner

OPTOELECTRONIC DEVICE INCLUDING A GATE AND A CATHODE COUPLED TO ONE ANOTHER

TECHNICAL FIELD AND PRIOR ART

The invention relates to the field of optoelectronic devices with a p-n junction, such as light-emitting diodes (LEDs or micro-LEDs), used in particular to make any kind of lighting device comprising LEDs (screens, projectors, video walls, etc.) or photodetector devices such as photodiodes. The invention applies advantageously to optoelectronic devices capable of emitting and/or receiving light in the wavelength spectrum ranging from the UV spectrum to the infrared spectrum (from approximately 100 nm to 10 μm).

A light-emitting diode emitting a blue light generally comprises a p-i-n junction including:

a p-doped GaN layer typically with $10^{19}$ acceptors/cm$^3$,
a non-intentionally-doped or intrinsic area of GaN typically comprising $10^{17}$ donors/cm$^3$ in which quantum wells of InGaN are formed, and
an n-doped GaN layer typically with $10^{19}$ donors/cm$^3$.

The non-intentionally-doped area comprising the quantum wells in which light emission is produced is called the active area.

A p-doped electron blocking layer of AlGaN with an aluminium concentration of between 8% and 15% may be added between the active area and the layer of p-doped GaN as described in the document "The influence of acceptor anneal temperature on the performance of InGaN/GaN quantum well light-emitting diodes", J. D. Thomson et al., Journal of Applied Physics 99, 024507 (2006). This electron blocking layer limits the movement of electrons from the active area to the p-doped GaN layer.

The primary problem limiting the efficiency of this type of light-emitting diode is the high activation energy of the acceptors in the p-doped GaN layer, which is typically on the order of 200 meV.

A light-emitting diode emitting in the ultraviolet spectrum (UV LED) can be made using AlGaN to make the p-i-n junction, with quantum wells made of GaN. The higher the aluminium concentration in the AlGaN, the greater the activation energy of the acceptors in the p-doped AlGaN. For example, this activation energy is on the order of 600 meV in AlN. The quantity of acceptors activated in the AlGaN is thus extremely small, limiting all the more the efficiency of such a UV LED.

To reduce the activation energy of the acceptors in such a UV LED, p-doped GaN may be used in place of p-doped AlGaN. However, this has the drawback of limiting the radiative efficiency in the active area of the UV LED, which is made of AlGaN. In addition, a portion of the UV light emitted in the active area is absorbed by the p-doped GaN.

In the examples described above, the observed limitations are due to the high activation energy of the acceptors in the p-n junction. It is also possible to encounter similar problems associated with a high activation energy of the donors when they are deep. For example, these problems arise in the case of LEDs in which the p-n junctions are made of diamond, because in this case the donors have a high ionisation energy (on the order of 460 meV).

In addition, similar problems are found in photodiodes, such as those intended, for example, for UV light detection and made from AlGaN or diamond.

In order to solve these problems and improve the internal quantum efficiency of an LED or photodiode, particularly when semiconductor materials with high acceptor or donor activation energies are used, document EP 2,960,951 A1 describes an optoelectronic device (for example, an LED or a photodiode) including a p-n junction made in the form of a mesa structure and coupled to an element capable of ionising doping agents of the p-n junction through the generation of an electric field, said element being formed against a portion of the lateral sides of the p-n junction.

Although such a doping agent ionising element is effective, this structure requires access to three electrodes: one for the anode, one for the cathode, and one for the ionisation element. In addition, the active area in such a device needs to be etched between the mesa structures, which causes a substantial loss of surface efficiency on the scale of the device.

Disclosure of the Invention

One purpose of the present invention is to propose an optoelectronic device wherein the efficiency is not limited by a high activation energy of the acceptors in a p-doped layer of the device, which does not require access to three separate electrodes, and wherein the structure does not involve etching an active area of the device.

To achieve this, the present invention proposes an optoelectronic device including at least:

a first p-doped semiconductor layer and a second n-doped semiconductor layer placed one on top of the other and together forming a p-n junction;
a first electrode electrically connected to the first semiconductor layer and forming an anode of the optoelectronic device;
a gate arranged against at least one lateral side of at least a portion of the first semiconductor layer;
a second electrode arranged against at least one lateral side of at least a portion of the second semiconductor layer, electrically connected to said portion of the second semiconductor layer and electrically insulated from the first semiconductor layer;

and wherein at least one portion of the second electrode is arranged against an electrically conducting material of the gate in such a way that the second electrode is electrically connected to the electrically conducting material of the gate and forms both a gate electrode and a cathode of the optoelectronic device.

In such an optoelectronic device, since the second electrode forms both the gate electrode and the cathode of the optoelectronic device, access to only two electrodes is sufficient to control the optoelectronic device.

By biasing the cathode and the gate to the same potential, the optoelectronic device functions in accumulation mode.

Thanks to the application of an electric potential to the gate that is different from that applied to the anode, this difference in potential obtained between the p zone and the gate creates an accumulation channel in the lateral side(s) of the p-doped semiconductor which is (are) covered by the gate. This makes it possible to increase the efficiency of the optoelectronic device (emission efficiency in the case of an LED), even if the optoelectronic device is made using materials with high acceptor activation energies.

In particular, this structure makes it possible to increase the emission efficiency of LEDs made from GaN and comprising an active area including InGaN wells, or LEDs made from AlGaN and comprising an active area including GaN wells.

Lastly, access to the lateral side or lateral sides of the p-doped semiconductor against which the gate is arranged does not require etching the p-n junction over the entire thickness thereof and, in particular, preserves a possible active area of the device placed within the p-n junction.

It is possible for the gate to cover only the lateral sides of the p-doped semiconductor and not the lateral sides of the n-doped semiconductor, making it possible to operate the device in accumulation mode.

The gate may be configured to create an accumulation channel at the lateral sides of the p-doped semiconductor covered by the gate.

The gate may include a gate dielectric having a permittivity greater than approximately 3.2 and an equivalent oxide thickness (EOT, which is the equivalent thickness of $SiO_2$ for achieving the same insulation) of between about 0.5 nm and 100 nm. Such a gate dielectric makes it possible to have a low leakage current and a high electric field in the gate dielectric (the leakage current is inversely proportional to the electric field). In this case, the gate dielectric corresponds to a so-called "High-K" dielectric corresponding, for example, to $HfO_2$, $Al_2O_3$, $Ta_2O_5$, or $ZrO_2$, the thickness of which, for example, is between about 2 nm and 50 nm.

The device may include at least one hole and/or a trench extending through the first semiconductor layer, and the gate may be arranged against at least a portion of the lateral sides of the hole and/or trench formed by the first semiconductor layer.

In particular, several trenches may extend through the first semiconductor layer, in which case the gate may be arranged in each trench against the lateral sides formed by the first semiconductor layer. With such trenches, the gate surface against the p-doped semiconductor is maximised.

In addition, at least a portion of the second electrode may extend through at least the second semiconductor layer from a bottom wall of the hole and/or trench.

As a variant, it is possible for at least a portion of the second electrode to extend through the first and second semiconductor layers, in which case electrical insulation is present between the second electrode and the portion of the first semiconductor layer through which the second electrode extends.

A portion of the gate may be arranged on the first semiconductor layer and be in contact with the second electrode.

The device may, in addition, include at least one metal layer that covers the first semiconductor layer and which is in contact with the first electrode. In this case, when the device includes at least one hole and/or one trench extending through the first semiconductor layer, the hole or holes and/or trenches may also extend through said metal layer.

The first semiconductor layer and/or the second semiconductor layer may advantageously include AlGaN.

The optoelectronic device may be a light-emitting diode or a photodiode.

The invention also relates to a method for making an optoelectronic device including at least the steps of:
making a first p-doped semiconductor layer and a second n-doped semiconductor layer placed one on top of the other and together forming a p-n junction;
making a gate arranged against at least one lateral side of at least a portion of the first semiconductor layer;
making a first electrode electrically connected to the first semiconductor layer and forming an anode of the optoelectronic device;
making a second electrode arranged against at least one lateral side of at least one portion of the second semiconductor layer, electrically connected to said portion of the second semiconductor layer and electrically insulated from the first semiconductor layer, such that at least one portion of the second electrode is arranged against an electrically conductive material of the gate so that the second electrode is electrically connected to the electrically conductive material of the gate and forms both a gate electrode and a cathode of the optoelectronic device.

The method may further include, between the making of the first and second semiconductor layers and the making of the gate, the making of at least one hole and/or trench through the first semiconductor layer, and the gate may subsequently be made in such a way that the gate is arranged against at least one portion of the lateral sides of the hole and/or the trench formed by the first semiconductor layer.

In addition, the making of the second electrode may include the making of at least one opening through at least the second semiconductor layer from a bottom wall of the hole and/or trench, and then filling of the opening with at least one electrically conductive material.

The method may be such that:
the making of the p-n junction additionally includes the making of an active emission area placed between the first and second semiconductor layers,
when a hole and/or trench is made through the first semiconductor layer, an etching forming the hole and/or trench is stopped at the active emission area in such a way that a bottom wall of the hole and/or trench is formed by the active emission area,
the gate is made so as to cover the bottom wall of the hole and/or trench.

The gate may be made by means of depositing at least one gate dielectric material against said at least one lateral side of at least one portion of the first semiconductor layer and on the first semiconductor layer, and depositing the electrically conductive material of the gate on the gate dielectric material, and wherein the second electrode may be made such that the portion of the second electrode arranged against the electrically conductive material of the gate is arranged on the first semiconductor layer.

BRIEF DESCRIPTION OF THE FIGURES

The present invention will be more readily understood from a reading of the description of embodiments, given purely as examples and not intended to limit in any way, in reference to the appended drawings, in which.

Identical, similar, or equivalent parts of the various figures described below have the same numerical references so as to facilitate the reading of the various figures.

In an effort to make the figures more legible, the various parts in the figures are not necessarily shown according to a uniform scale.

The various possibilities (variants and embodiments) must be understood as not being exclusive of each other, and may therefore be combined.

DETAILED DESCRIPTION OF PARTICULAR EMBODIMENTS

Figure 1:
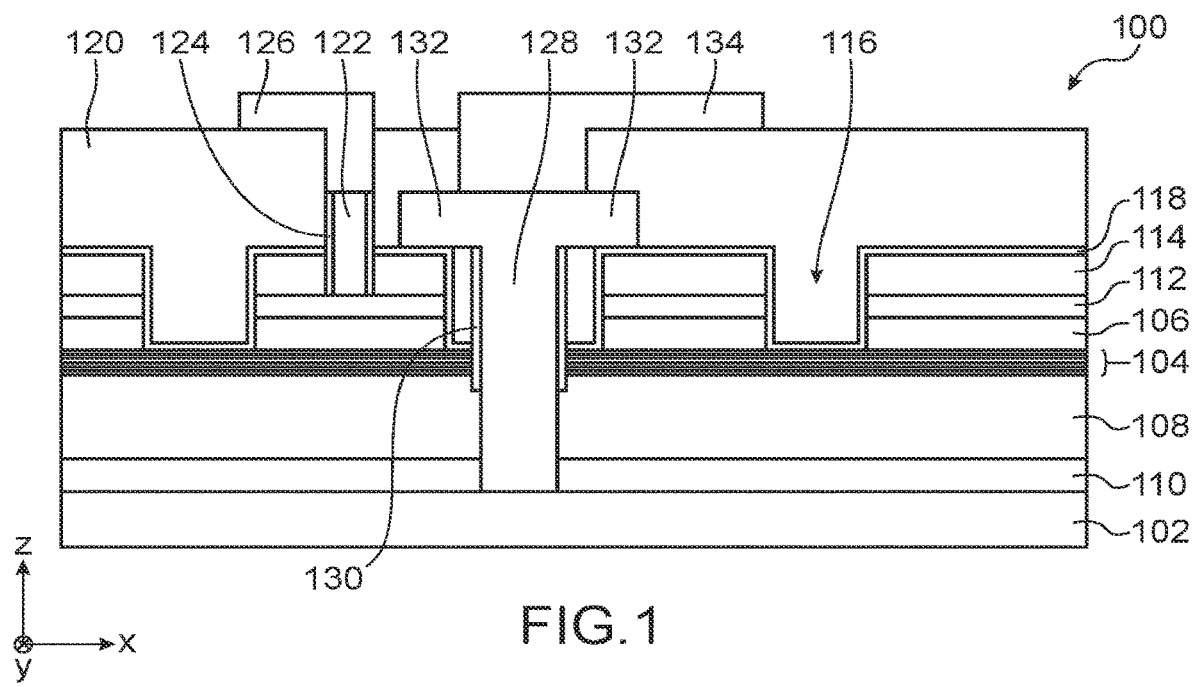
FIG. 1 is a schematic diagram of a particular embodiment of an optoelectronic device of the present invention.

Reference is first made to FIG. 1, which shows an optoelectronic device 100 according to a particular embodiment. In this embodiment, optoelectronic device 100 is a light-emitting diode, or LED.

LED 100 includes a substrate 102 intended to be used as a support for growing additional layers of LED 100. For example, substrate 102 includes sapphire and the thickness thereof (the dimension parallel to the Z-axis shown in FIG. 1) is for example equal to about 500 μm.

LED 100 includes an active area 104 comprising one or more emission layers, each forming a quantum well, including for example AlGaN, and each being placed between two barrier layers including for example GaN or AlGaN (with an aluminium concentration less than that of the AlGaN of the emission layer or layers). The AlGaN of the emission layers includes for example 50% aluminium, which makes it possible to obtain a UV light emission at a wavelength of about 260 nm. All the layers in active area 104, that is, the emission layer or layers and the barrier layers, include intrinsic semiconductor materials, that is, materials not intentionally doped (with a residual donor concentration $n_{nid}$ equal to, for example, about $10^{17}$ donors/cm³, or between about $10^{15}$ and $10^{18}$ donors/cm³). The thickness of the or each emission layer is, for example, equal to about 1 nm and more generally is between about 0.5 nm and 10 nm, and the thickness of each barrier layer is, for example, equal to about 5 nm or is between about 1 nm and 25 nm. The space-charge region of LED 100 is primarily located in this active area 104.

As a variant, active area 104 may be made from GaN with one or more emission layers including InGaN.

Active area 104 is placed between a first p-doped semiconductor layer 106 and a second n-doped semiconductor layer 108, with the two semiconductor layers 106 and 108 forming the p-n junction of LED 100 (or, more precisely, the p-i-n junction in light of active area 104 including intrinsic semiconductor material placed between doped layers 106 and 108). These layers 106 and 108 and active area 104 are arranged in relation to each other in such a way that second layer 108 is placed between active area 104 and substrate 102.

Layers 106 and 108 include, for example, AlGaN. In addition, the AlGaN of layers 106 and 108 includes, for example, 70% aluminium. First layer 106 is p-doped with, for example, a concentration of acceptors (holes) of between about $10^{17}$ and $5 \cdot 10^{19}$ acceptors/cm³, which in the present case is equal to $5 \cdot 10^{17}$ acceptors/cm³. Second layer 108 is n-doped with, for example, a concentration of donors (electrons) of between about $10^{17}$ and $5 \cdot 10^{19}$ donors/cm³, which in the present case is equal to $5 \cdot 10^{18}$ donors/cm³ Each of the two semiconductor layers 108 and 106 has, for example, a thickness of between about 20 nm and 10 μm. In the example described here, first semiconductor layer 106 has a thickness equal to about 200 nm and second semiconductor layer 108 has a thickness equal to about 1 μm. Second semiconductor layer 108 is placed on a buffer layer 110 located between second layer 108 and substrate 102, and includes for example n-doped AlGaN with a concentration, for example, equal to about $10^{19}$ donors/cm³ and a thickness equal to about 2 μm. Buffer layer 110 advantageously includes the same semiconductor and is doped in the same way as second layer 108.

Aluminium proportions other than those described above, or semiconductor materials other than AlGaN, such as GaN and/or InGaN, for instance, may be used in LED 100, particularly in light of the range of wavelengths intended to be emitted by LED 100.

LED 100 also includes a layer of electrically conductive material 112, metal in the present case, placed on first semiconductor layer 106 and electrically connected to that layer, thus forming a part of the anode of LED 100. Layer 112 includes, for example, Ag and/or Al. Layer 112 has a thickness, for example, of between about 20 nm and 2 μm.

Layer 112 is covered with a hard mask 114 comprising a dielectric material, for example $SiO_2$, which serves the purpose of making trenches 116 formed through layers 106 and 112 when LED 100 is being made. The thickness of hard mask 114 is, for example, between about 100 nm and 2 μm.

Trenches 116 made through layers 112 and 106 form locations in which a gate of LED 100 is formed. As a general rule, one or more holes and/or trenches 116 are made through at least first layer 106 so as to form areas of contact with the p-doped semiconductor for the gate.

A layer of gate dielectric material and a layer of gate electrically conductive material, designated together by reference number 118 and shown in FIG. 1 as forming a single layer, cover hard mask 114 as well as the side walls of trenches 116, which are formed by hard mask 114 and first layer 106, and the bottom walls of trenches 116 formed by active area 104. These layers 118 form the gate of LED 100. The layer of gate dielectric material may include at least one dielectric material that is preferably of the "high-k" type, that is, a material with a dielectric constant greater than that of $SiO_2$, that is, greater than about 3.2. As such, this material is, for example, $Al_2O_3$, $HfO_2$, $ZrO_2$, $Ta_2O_5$, or a stack of several of these dielectric materials. Using a "high-k" dielectric material makes it possible to have a thicker gate dielectric than when a dielectric material that is not "high-k" is used.

This layer of gate dielectric material is thin and is, for example, between about 2 nm and 50 nm thick. More specifically, the gate dielectric material or materials and the thickness of this or these materials are chosen so that the Equivalent Oxide Thickness (EOT) of this or these layers of materials is between about 0.5 nm and 100 nm.

Here, the layer of electrically conductive material of gate 118 includes a first layer forming a diffusion barrier, comprising for example TiN, TaN, WN, and a second metal layer comprising for example tungsten, aluminium, and so on. The thickness of the first layer forming the diffusion barrier of grid 118 is, for example, between about 1 nm and 20 nm, and the thickness of the second metal layer is, for example, between about 50 nm and 1 μm. This or these gate conductive materials are chosen so as to have chemical properties compatible with the other materials of the LED, in particular the diffusion barrier properties thereof. Here, the materials used are chosen so that the band diagrams of the semiconductor used in LED 100, of the gate dielectric, and of the gate conductive material minimise the work function of the electric charges of the gate conductive material, and therefore the gate voltage. For example, when LED 100 is made of AlGaN, an $Al_2O_3$/TiN/W stack may be used to form gate 118.

Because of trenches 116 made through layers 106, 112, and 114, gate 118 is placed against the lateral walls of several portions of first semiconductor layer 106, which overall affords a large contact surface between gate 118 and first semiconductor layer 106 in LED 100. In addition, as can be seen in FIG. 1, gate 118 only covers the lateral sides of the p-doped semiconductor of layer 106 and not those of the n-doped semiconductor of layer 108.

Gate 118 is covered with another dielectric material 120, for example $SiO_2$ or SiN, the thickness of which is, for example, between about 10 nm and 10 μm.

Layer 112 is electrically accessible from the outside of LED 100 thanks to a first electrode 122 made through dielectric material 120, gate 118, and hard mask 114, and which is in electrical contact with layer 112. First electrode 122 forms the anode of LED 100. A portion of the lateral walls of this first electrode 122, particularly at hard mask 114 and gate 118, is covered with a dielectric layer 124 providing for electrical insulation between gate 118 and first electrode 122. First electrode 122 includes a portion 126 lying on dielectric material 120 and forming a contact pad from which an electric potential can be applied from the outside of LED 100.

A second electrode 128 extends through dielectric material 120. This second electrode 128 is formed in one of trenches 116 and extends through gate 118, active area 104, layer 108, and buffer layer 110. A dielectric layer 130 covers a portion of the lateral walls of this second electrode 128 in order to insulate this second electrode 128 electrically from active area 104. A portion of the lateral walls of second electrode 128 is in electrical contact with layers 108 and 110, and this second electrode 128 forms the cathode of LED 100.

Portions 132 of second electrode 128 are arranged on gate 118 and are electrically connected to the conductive material of gate 118. Consequently, this second electrode 128 allows the same electric potential to be applied to gate 118 and to n-doped layers 108 and 110. Second electrode 128 includes a portion 134 lying on dielectric material 120 and forming a contact pad from which an electric potential can be applied from the outside of LED 100.

Each of electrodes 122 and 128 includes, for example, a stack of a plurality of conductive materials and each one is formed, for example, of a Ti/TiN/Cu multilayer, with thicknesses of these materials ranging, for example, from about 10 nm to 1 μm. Dielectric layers 124 and 130 include, for example, SiN, $TiO_2$, $SiO_2$, $Al_2O_3$, $ZrO_2$, or $HfO_2$, and form layers having a thickness, for example, of between approximately 50 nm and 5 μm against the lateral walls of electrodes 122 and 128.

Thus, thanks to the small thickness and high dielectric constant of the dielectric material of gate 118, in LED 100 the leak current through this gate dielectric is very low and the electric field obtained in this gate dielectric is strong. Given the small thickness of this dielectric, the high dielectric constant of the gate dielectric furthermore avoids the appearance of a conduction region due to the tunnel effect between the gate conductive material and the semiconductor material of layer 106, which would lead to a drop in the electric field in the gate dielectric.

In LED 100, it is advantageous for the gate to be made with as great a density as possible to increase the semiconductor surface area of layer 106 in contact with gate 118. To that end, trenches 116 may be made with a high density in LED 100.

Gate 118 placed around the junction of LED 100 makes it possible to create an accumulation channel at the lateral sides of the p-doped semiconductor of layer 106 and thus to increase the recombination efficiency by injecting more holes into active area 104. Since gate 118 is electrically connected to the cathode of LED 100, operation of LED 100 in accumulation mode is obtained.

The effect of gate 118 around the p-doped semiconductor is beneficial regardless of the structure of the active area and, in particular, regardless of the number of quantum wells.

A p-doped electron blocking layer made of AlGaN, for example, with an aluminium concentration of between 8% and 100%, may furthermore be placed between active area 104 and p-doped semiconductor layer 106. In this case, it is advantageous to form gate 118 around this electron blocking layer.

According to a variant, it is possible for LED 100 not to include active area 104, in which case first p-doped semiconductor layer 106 is placed directly on second n-doped semiconductor layer 108. The space-charge region is then located only in layer 106.

Figure 3:
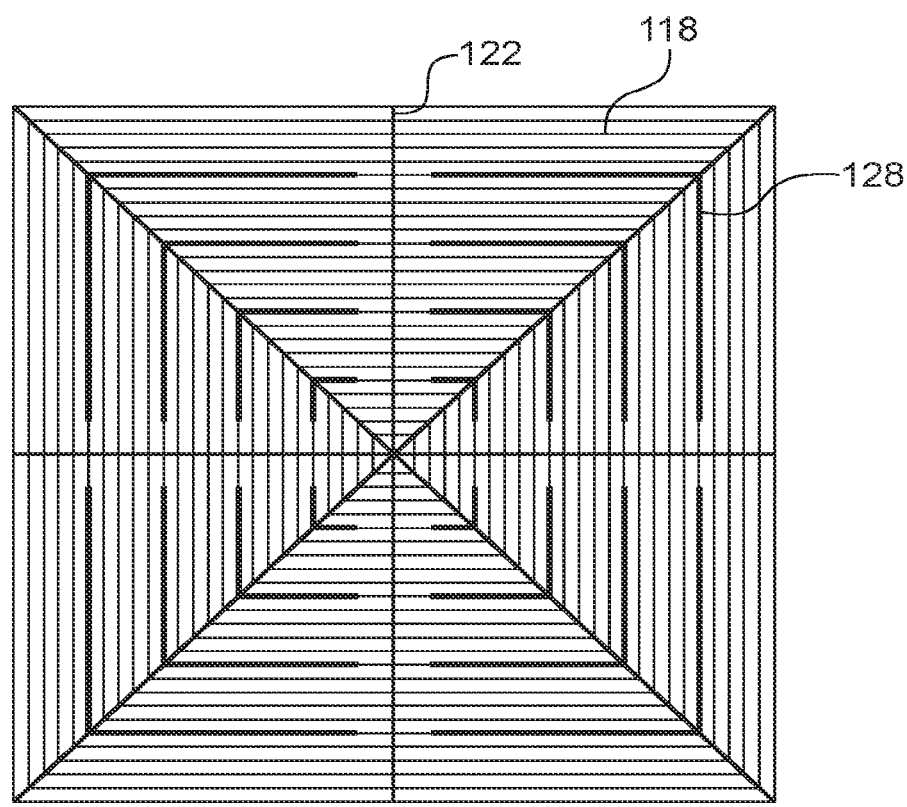
FIG. 3 shows a top view of an optoelectronic device of the present invention, according to a particular embodiment.

FIG. 3 shows a top view of LED 100. In this top view, gate 118, first electrode 122, and second electrode 128 are made according to an arrangement providing for the continuity of electrodes 122 and 128 and the connection between gate 118 and second electrode 128.

A method for making LED 100 is described below in conjunction with FIGS. 2A to 2J.

The stack of layers 110, 108, 104, 106, and 112 is first made on substrate 102. Hard mask 114 is then made on layer 112, such as by photolithography and etching. The pattern of this hard mask 114 corresponds to that of trenches 116 to be made at a subsequent time.

Figure 2A:
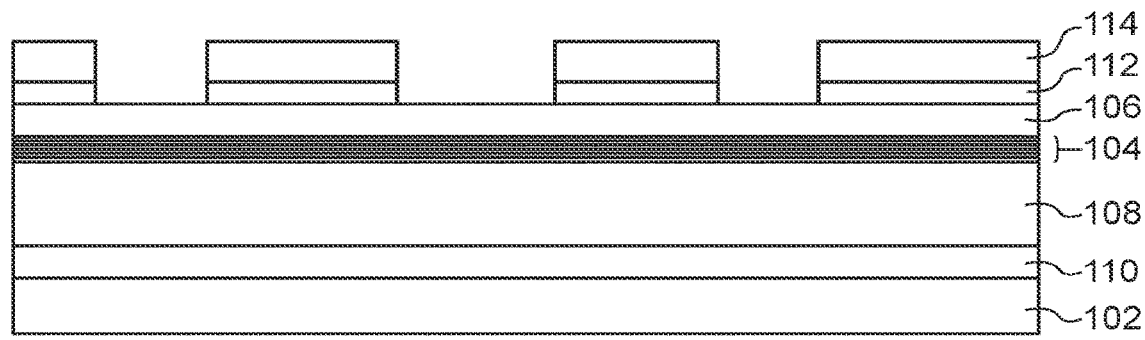
FIGS. 2A to 2J show the steps of a method for making an optoelectronic device of the present invention, according to a particular embodiment.

Layer 112 is then etched according to the pattern defined by hard mask 114 (FIG. 2A).

Figure 2B:
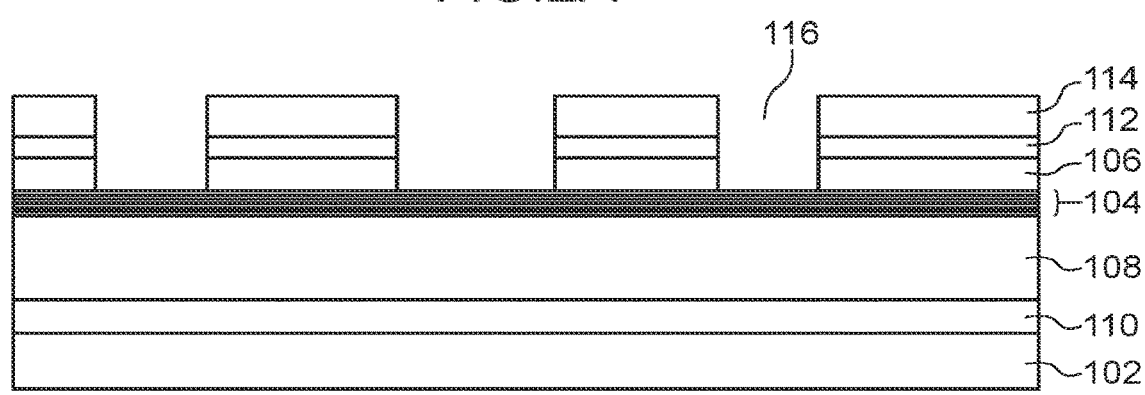

Next, layer 106 is also etched according to the pattern of hard mask 114 and stops at active area 104 (FIG. 2B). This etching is, for example, Reactive Ion Etching (RIE) or ICP etching implemented using an etching agent such as $Cl_2$ or Br. This etching completes the making of trenches 116 through layers 106, 112, and 114.

Figure 2C:
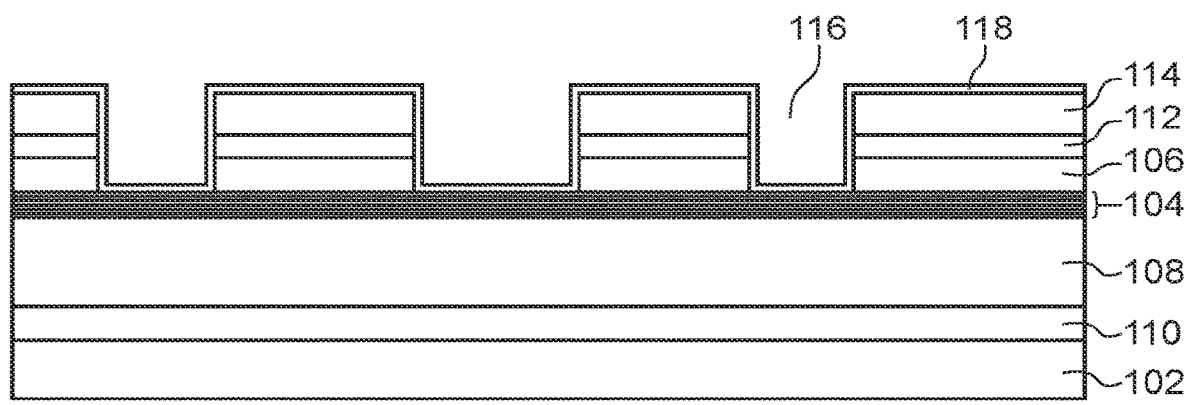

As shown in FIG. 2C, the layers of gate dielectric material and gate conductive material 118 are then deposited. The gate dielectric includes, for example, $Al_2O_3$, $HFO_2$, $Ta_2O_5$, or $ZrO_2$, which is deposited, for example, by ALD (atomic layer deposition). The gate conductive material or materials are, for example, TiN, TaN, or WN, which are deposited, for example, by CVD (chemical vapour deposition).

Figure 2D:
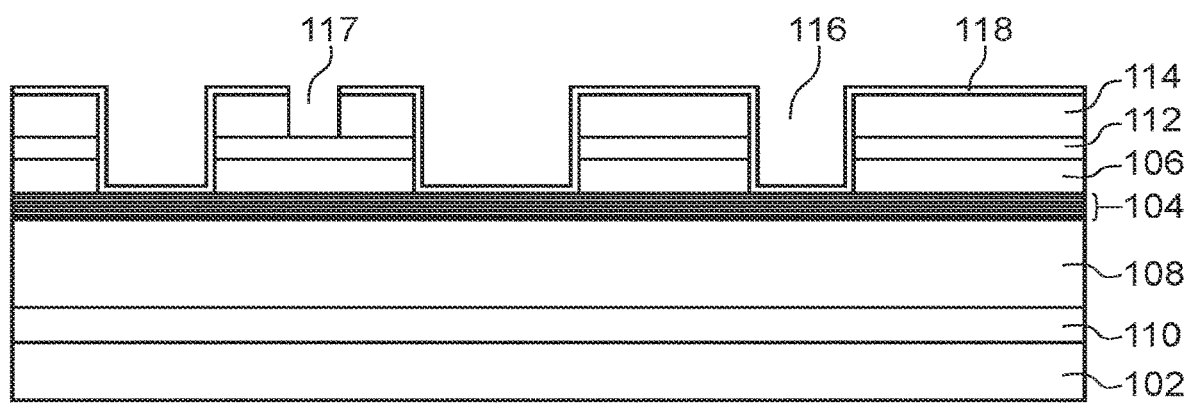

Opening 117 is made through hard mask 114 by lithography and etching, providing access to electrically conductive layer 112 (FIG. 2D). This opening 117 forms the location of first electrode 122, which is intended to be the anode of LED 100.

Figure 2E:
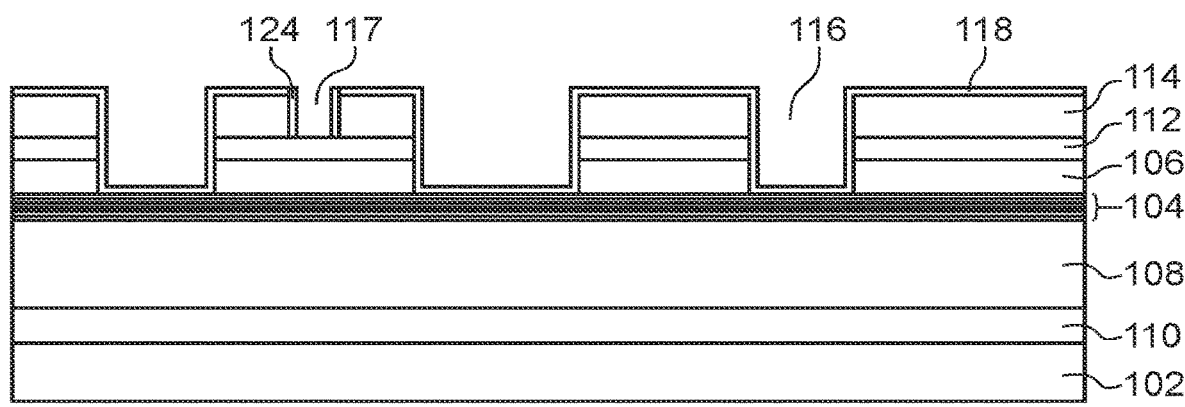

Dielectric layer 124 is then made, for instance by deposition and etching, against the lateral walls of opening 117 so as to subsequently provide electrical insulation between first electrode 122 and gate 118 (FIG. 2E).

Dielectric material 120 is then deposited on the entirety of the completed structure, thus covering gate 118. This dielectric material 120 is placed in particular in trenches 116 and on the portions of layers 106, 112, and 114 between which trenches 116 are located.

Figure 2F:
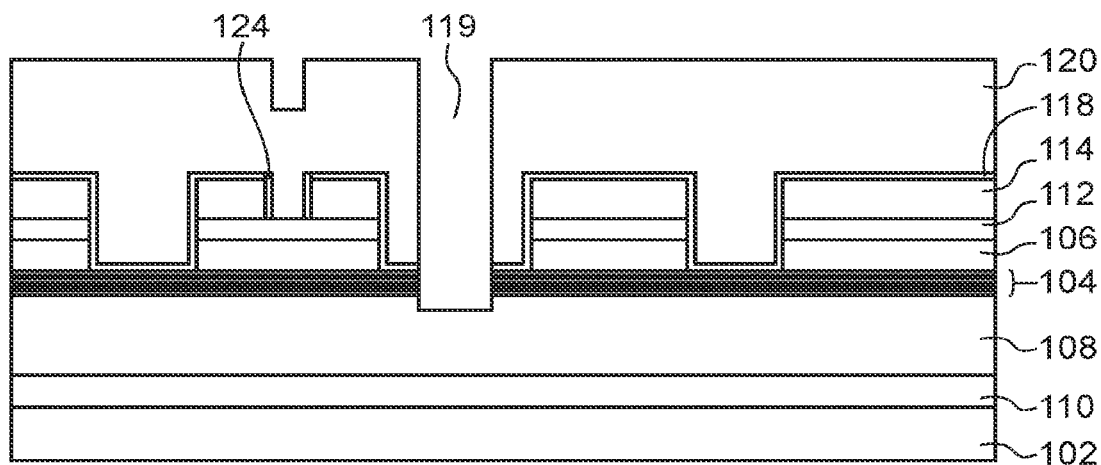

Dielectric material 120 is then structured by lithography and etching to form a hard mask intended to create a location for second electrode 128 at the p-n junction. To create this location, a first etching of active area 104 is performed according to the pattern of this hard mask, forming an opening 119 corresponding to this location (FIG. 2F). This etching is, for example, RIE or ICP etching implemented using an etching agent such as $Cl_2$ or Br. This etching forms a portion of the location. This opening 119 may extend through a portion of the thickness of layer 108.

Dielectric layer 130 is then deposited on the entire structure and particularly along the walls of opening 119 made through gate 118 and active area 104, and possibly a portion of layer 108. The portions of dielectric layer 130 not covering lateral sides formed by dielectric material 120, that is, the portions of this dielectric layer placed on the upper surface of dielectric material 120 and on the bottom wall of opening 119, are eliminated.

Figure 2G:
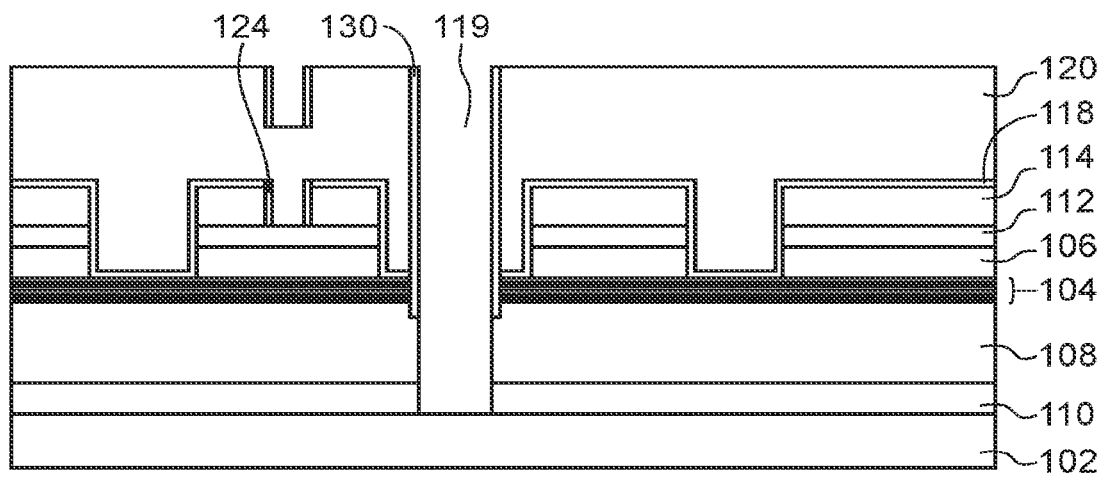

Opening 119 is then extended through layers 108 and 110 by means of etching through these layers and stops at substrate 102 (FIG. 2G).

Figure 2H:
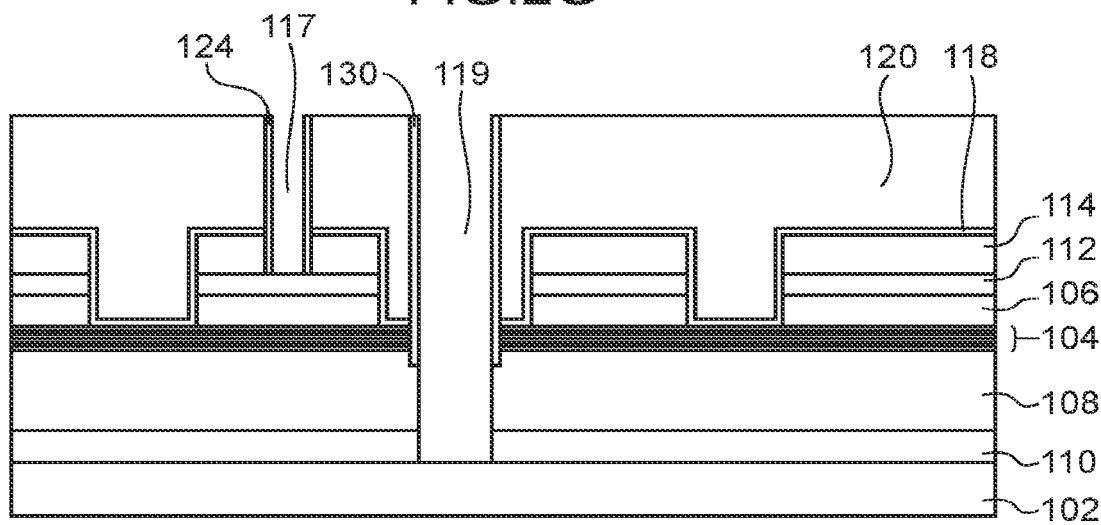

The portion of dielectric material 120 filling location 117 of first electrode 122 is then eliminated by etching (FIG. 2H). After total opening of location 117, dielectric material is again deposited so that dielectric layer 124 covers the entirety of the lateral walls of location 117 from the upper surface formed by dielectric material 120 to layer 112.

Figure 2I:
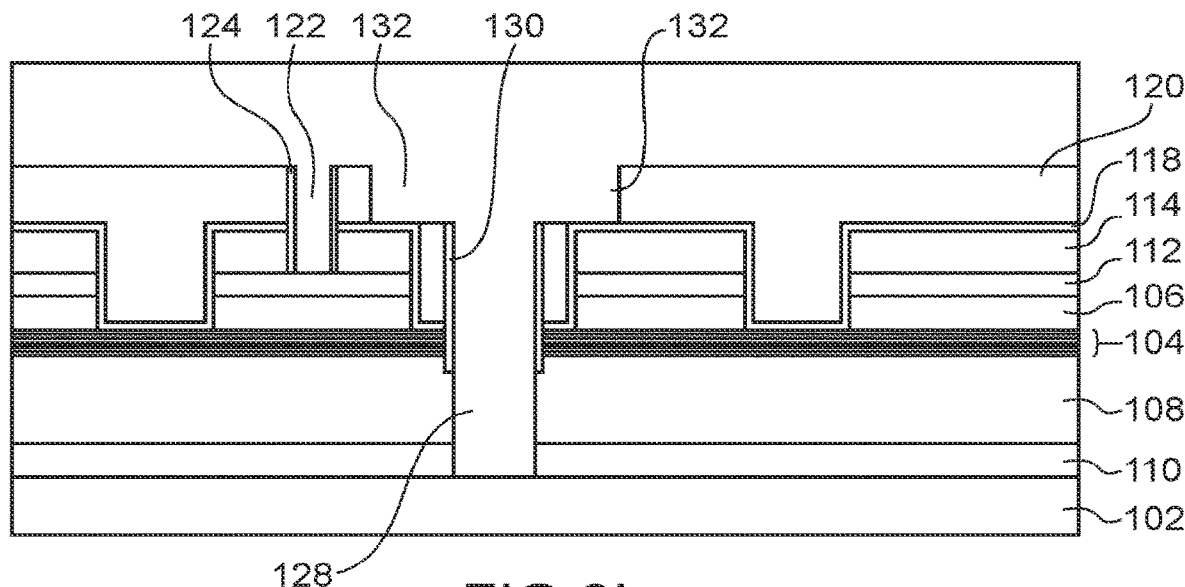

Dielectric material 120 is then etched again to form locations for portions 132 of second electrode 128, which are intended to be in contact with gate 118. One or more conductive materials are then formed, in particular in openings 117 and 119, to make electrodes 122 and 128. Electrodes 122 and 128 may be made by first depositing a stack of metal layers, for example a superimposing of three Ti/TiN/Cu layers, then by performing copper ECD (electrochemical deposition) in order to fill openings 117 and 119. The conductive materials of electrodes 122 and 128 are also deposited on dielectric material 120 as well as in the locations previously etched to form portions 320 (FIG. 2I).

Figure 2J:
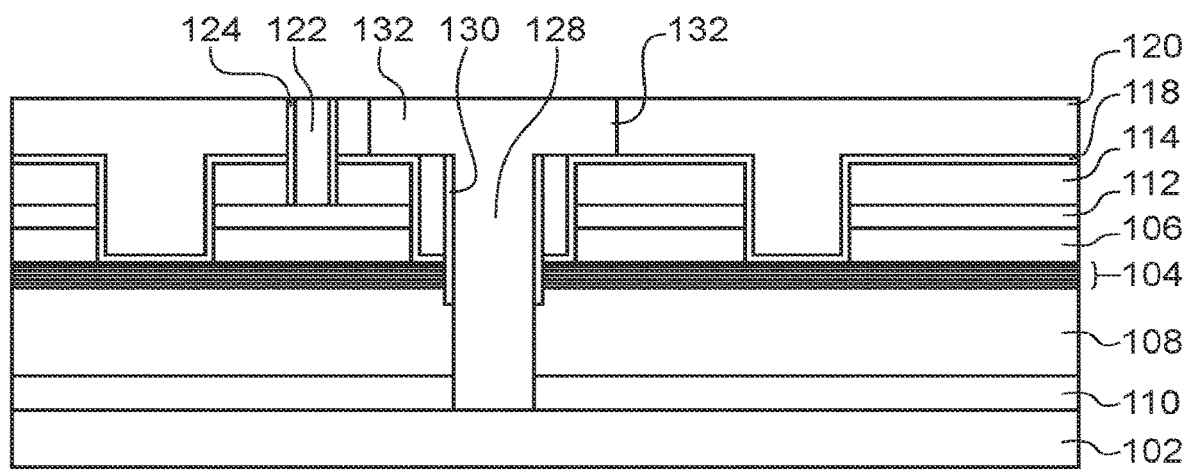

A chemical-mechanical planarization (CMP) is then performed to eliminate the portions of conductive materials present in dielectric material 120 (FIG. 2J).

LED 100 is then completed by a deposition of dielectric material, thus completing the thickness of dielectric material 120 already present. Lithography and etching steps are implemented to form openings through this dielectric material in front of electrodes 122 and 128. One or more electrically conductive materials are then deposited in these openings and on the dielectric material. The making of electrodes 122 and 128 is completed by implementing lithography and etching steps in order to create parts 126 and 134 forming contact pads for electrodes 122 and 128. Device 100 thus obtained corresponds to the device shown in FIG. 1.

Several LEDs similar to LED 100 may be made adjacent to each other on substrate 102. In addition, second n-doped semiconductor layer 108 may be common to all the LEDs. In this case, individual addressing of the LEDs may be achieved by means of the anode specific to each LED.

As a variant, it is possible to replace the gates with any devices capable of creating a space-charge region on the surface of the p-type semiconductor, such as, for example, Schottky contacts or any stacks capable of approximating a reverse-biased semiconductor junction.

One or more LEDs 100 according to one of the various embodiments described above may be incorporated into a light-emitting device.

As a variation of the various embodiment examples described earlier, item 100, instead of being an LED, may be a photodiode including a p-n or p-i-n junction. As in the case of the LED described above, the gate or gates are used in this case to create an accumulation channel in the lateral sides of the p-doped semiconductor, which are covered by the gate.

The invention claimed is:

1. An optoelectronic device including at least:
   a first p-doped semiconductor layer and a second n-doped semiconductor layer placed one on top of the other and together forming a p-n junction;
   a first electrode electrically connected to the first semiconductor layer and forming an anode of the optoelectronic device;
   a gate arranged to physically contact at least one lateral side of at least a portion of the first semiconductor layer; and
   a second electrode arranged to physically contact at least one lateral side of at least a portion of the second semiconductor layer, electrically connected to said portion of the second semiconductor layer, and electrically insulated from the first semiconductor layer,
   wherein at least one portion of the second electrode is arranged to physically contact an electrically conducting material of the gate in such a way that the second electrode is electrically connected to the electrically conducting material of the gate and forms both a gate electrode and a cathode of the optoelectronic device.

2. The optoelectronic device according to claim 1, wherein the gate includes a gate dielectric having a permittivity greater than about 3.2 and an equivalent oxide thickness of between about 0.5 nm and 100 nm.

3. The optoelectronic device according to claim 1, further including at least one hole and/or trench extending through the first semiconductor layer,
   wherein the gate is arranged to physically contact at least a portion of lateral sides of the at least one hole and/or trench formed by the first semiconductor layer.

4. The optoelectronic device according to claim 3, wherein a plurality of trenches extend through the first semiconductor layer, with the gate being placed in each trench to physically contact lateral sides formed by the first semiconductor layer.

5. The optoelectronic device according to claim 3, wherein at least a portion of the second electrode extends through at least the second semiconductor layer from a bottom wall of the at least one hole and/or trench.

6. The optoelectronic device according to claim 1, further including an active emission area placed between the first and second semiconductor layers,
   wherein, when a hole and/or trench extends through the first semiconductor layer, a bottom wall of the hole and/or of the trench is formed by the active emission area and is covered by the gate.

7. The optoelectronic device according to claim 1, wherein a portion of the gate is placed on the first semiconductor layer and is in physical contact with the second electrode.

8. The optoelectronic device according to claim 1, further including at least one metal layer covering the first semiconductor layer and in physical contact with the first electrode.

9. The optoelectronic device according to claim 1, wherein the first semiconductor layer and/or the second semiconductor layer includes AlGaN.

10. A method for making an optoelectronic device including at least the steps of:
   making a first p-doped semiconductor layer and a second n-doped semiconductor layer placed one on top of the other and together forming a p-n junction;
   making a gate arranged to physically contact at least one lateral side of at least a portion of the first semiconductor layer;
   making a first electrode electrically connected to the first semiconductor layer and forming an anode of the optoelectronic device;
   making a second electrode arranged to physically contact at least one lateral side of at least one portion of the second semiconductor layer, electrically connected to said portion of the second semiconductor layer, and electrically insulated from the first semiconductor layer, such that at least one portion of the second electrode is arranged to physically contact an electrically conductive material of the gate so that the second electrode is electrically connected to the electrically conductive material of the gate and forms both a gate electrode and a cathode of the optoelectronic device.

11. The method according to claim 10, further including, between the making of the first and second semiconductor layers and the making of the gate, making at least one hole and/or trench through the first semiconductor layer, wherein the gate is subsequently made in such a way that the gate is arranged to physically contact at least one portion of lateral sides of the hole and/or the trench formed by the first semiconductor layer.

12. The method according to claim 11, wherein the making of the second electrode includes making at least one opening through at least the second semiconductor layer from a bottom wall of the hole and/or trench, and then filling the at least one opening with at least one electrically conductive material.

13. The method according to claim 10, wherein:

the making of the p-n junction additionally includes making an active emission area placed between the first and second semiconductor layers, when a hole and/or trench is made through the first semiconductor layer, an etching forming the hole and/or trench is stopped at the active emission area in such a way that a bottom wall of the hole and/or trench is formed by the active emission area, and the gate is made so as to cover the bottom wall of the hole and/or trench.

14. The method according to claim 10, wherein the gate is made by means of depositing at least one gate dielectric material to physically contact said at least one lateral side of the at least one portion of the first semiconductor layer and on the first semiconductor layer, and depositing the electrically conductive material of the gate on the gate dielectric material, and wherein the second electrode is made such that the portion of the second electrode arranged to physically contact the electrically conductive material of the gate is arranged on the first semiconductor layer.

* * * * *